(12) United States Patent
Yu

(10) Patent No.: US 6,566,936 B1
(45) Date of Patent: May 20, 2003

(54) TWO TERMINAL RECTIFIER NORMALLY OFF JFET

(75) Inventor: Ho-Yuan Yu, Saratoga, CA (US)

(73) Assignee: Lovoltech Inc., Santa Clara, CA (US)

( * ) Notice: Subject to any disclaimer, the term of this patent is extended or adjusted under 35 U.S.C. 154(b) by 0 days.

(21) Appl. No.: 09/670,176

(22) Filed: Sep. 25, 2000

Related U.S. Application Data

(63) Continuation-in-part of application No. 09/430,500, filed on Oct. 29, 1999, now Pat. No. 6,251,716.
(60) Provisional application No. 60/167,959, filed on Nov. 29, 1999.

(51) Int. Cl.$^7$ ............................................. H03K 17/687
(52) U.S. Cl. ...................... 327/430; 327/303; 327/304; 327/325; 327/327
(58) Field of Search ................................ 327/303, 304, 327/313, 314, 321, 325, 327, 328, 336, 330, 430, 431, 434

(56) References Cited

U.S. PATENT DOCUMENTS

| | | | | |
|---|---|---|---|---|
| 4,700,461 A | * | 10/1987 | Choi et al. ................... | 438/149 |
| 4,743,862 A | * | 5/1988 | Scheinberg ................. | 330/277 |
| 4,825,174 A | * | 4/1989 | Vella-Coleiro .............. | 330/264 |
| 4,853,561 A | * | 8/1989 | Gravrok ...................... | 307/443 |
| 4,995,084 A | * | 2/1991 | Pritchard ..................... | 379/94 |
| 6,181,541 B1 | * | 1/2001 | Souri et al. .................. | 361/106 |

* cited by examiner

Primary Examiner—Terry D. Cunningham
Assistant Examiner—Quan Tra
(74) Attorney, Agent, or Firm—Wagner, Murabito & Hao LLP

(57) ABSTRACT

A two terminal semiconductor circuit that can be used to replace the semiconductor diodes used as rectifiers in conventional DC power supply circuits. Three semiconductor circuits that can efficiently supply the DC currents required in both discrete and integrated circuits being operated at low DC supply voltages are disclosed. All three circuits have a forward or current conducting state and a reverse or non current conducting state similar to a conventional semiconductor diode. In a first configuration, an asymmetrical, enhancement mode, Junction Field Effect Transistor (JFET) is utilized as a two terminal device by connecting together the gate and source leads. The terminal voltage in the conducting state is considerably smaller than conventional semiconductor diodes. In a second configuration, an asymmetrical, enhancement mode, Junction Field Effect Transistor (JFET) is connected with a transformer such that the source and the drain serve as the two leads of a two terminal circuit. The voltage drop between source and drain when in the on or current conducting state is less than 0.1 volts, which is smaller than that obtained in the first configuration. In a third configuration, an asymmetrical, enhancement mode, Junction Field Effect Transistor (JFET) is connected with a voltage step up circuit such that the source and the drain serve as the two leads of a two terminal circuit. The voltage drop between source and drain when in the on or current conducting state is less than 0.1 volts, which is smaller than that obtained in the first configuration.

14 Claims, 7 Drawing Sheets

400

600

TWO TERMINAL RECTIFIER NORMALLY OFF JFET

RELATED APPLICATIONS

The following U.S. patent application Ser. No. 09/430,500, "NOVEL JFET STRUCTURE AND MANUFACTURE METHOD FOR LOW ON RESISTANCE AND LOW VOLTAGE APPLICATIONS", Ho-Yuan Yu, filed Oct. 29, 1999, now U.S. Pat. No. 6,251,716, is incorporated herein by reference for all purposes. The following copending U.S. patent application Ser. No. 60/167,959, "STARTER DEVICE FOR NORMALLY "OFF" JFETS", Ho-Yuan Yu, filed Nov. 29, 1999, is incorporated herein by reference for all purposes.

FIELD OF THE INVENTION

The present invention relates generally to the field of low voltage, high current DC power supplies. More particularly, the present invention relates to utilization of asymmetrical, normally off Junction Field Effect Transistors (JFET) to construct two terminal rectifier circuits useful in low voltage and high current density DC power supply circuits.

RELATED ART

The increasing trend toward lower supply voltages for active semiconductor devices and Integrated Circuits (IC's) has accelerated the search for more efficient low voltage power sources. Conventional power supplies utilizing silicon diode rectifiers are unacceptable in low voltage applications due to the excessive voltage drop across the forward biased diode terminals. Power loss in the diodes becomes excessive when they are used as rectifiers in a DC power supply designed for a terminal voltage as low as 3.0 volts.

Semiconductor diodes are combined with active devices to form circuits capable of producing low value DC supply voltages, but such circuits are generally not capable of handling the large currents frequently required. They usually exhibit a fairly large internal resistance and as such are very inefficient power sources. Furthermore, the number and complexity of steps required in the processing of this type of circuit as an IC also increases with the number of devices included.

Active semiconductor devices are used as switches in circuit arrangements producing DC power supply voltages, as for example in switched mode power supplies. Junction Field Effect Transistors (JFET) are frequently used as switches because they are easily switched between an ON or conducting state and an OFF or non-conducting state. Most importantly, the current carriers in a JFET are all majority carriers which results in short switching times. However, when operated at lower voltages, JFETs exhibit an internal resistance in the ON state that make them unsatisfactory and inefficient in applications requiring large currents.

In U.S. Pat. No. 4,523,111 entitled "Normally-Off Gate-Controlled Electric Circuit with Low On-Resistance", Baliga disclosed a JFET serially connected to an Insulated Gate Field Effect Transistor (IGFET). The ON resistance of this circuit is the sum of the JFET resistance and the IGFET resistance. As a result, the ON resistance is too large and therefore unsatisfactory for low voltage operations requiring large currents.

In a similar invention disclosed in U.S. Pat. No. 4,645,957 entitled "Normally Off Semiconductor Device with Low On-Resistance and Circuit Analogue" by Baliga, a JFET is serially connected to a Bipolar Junction Transistor (BJT). The ON resistance is the sum of the JFET and the BJT which is again too large for low voltage applications requiring large currents.

In an invention disclosed in U.S. patent application Serial No. 60/167,959, "STARTER DEVICE FOR NORMALLY "OFF" JFETS", Ho-Yuan Yu, filed Nov. 29, 1999, a normally OFF JFET is combined in parallel with one or more active devices defined as starter devices. In a first case, a BJT acting as the starter device is connected in parallel with the normally OFF JFET. In a second case, a Metal Oxide Silicon Field Effect Transistor (MOSFET) acting as the starter device is connected in parallel with the normally OFF JFET. In a third case, three normally OFF JFETs are connected serially as a starter device, and are then connected in parallel with the normally OFF JFET. Each of the resulting structures provide high current carrying capacity at low voltage levels, but still exhibit a larger than desired internal resistance in the ON or conducting state. Furthermore, the required starter devices all necessitate an increase in the number of steps and in the complexity of the IC processing recipe.

SUMMARY OF THE INVENTION

Accordingly, what is needed is a semiconductor circuit that can efficiently supply the DC currents required in both discrete and integrated circuits being operated at low DC supply voltages. What is further needed is a two terminal semiconductor circuit that can be used to replace the semiconductor diodes used in conventional DC power supply circuits. What is also needed is a two terminal semiconductor circuit that has a very low internal resistance such that the power dissipated in the circuit itself is only a fraction of that delivered to a connected load. What is needed yet is a two terminal semiconductor circuit that exhibits short switching times between an on or conducting state and an off or non-conducting state. The present invention provides these advantages and others not specifically mentioned above but described in the sections to follow.

A semiconductor circuit that can efficiently supply the DC currents required in both discrete and integrated circuits being operated at low DC supply voltages is disclosed. In the present invention, an asymmetrical, enhancement mode, Junction Field Effect Transistor (JFET) is utilized as a two terminal device by connecting together the gate and source leads. With an external voltage applied between source and drain with a polarity that will forward bias the p-n junctions between gate and drain, low resistance, current conducting channels are formed between source and drain. This is the on or current conducting state. The forward voltage drop of this configuration is aproximately the threshold voltage of the normally off JFET. With an external voltage applied between source and drain with a polarity that will reverse bias the p-n junctions between gate and drain, the built-in p-n junction depletion regions will isolate the source and drain leads to prevent the conduction of electric current between source and drain. This is the off or non conducting state. Thus, this two terminal device has a forward or current conducting state and a reverse or non current conducting state similar to a conventional semiconductor diode.

In a second configuration, an asymmetrical, enhancement mode, Junction Field Effect Transistor (JFET) is connected with a transformer such that the source and the drain serve as the two leads of a two terminal circuit. The primary of the transformer is connected between the drain and source leads, while the secondary is connected between the gate and source leads. The transformer is connected such that a voltage induced at the secondary is greater than and 180 degrees out of phase with the primary voltage. With an external voltage applied between source and drain with a polarity that will forward bias the p-n junctions between gate and source, low resistance, current conducting channels are formed between source and drain. This is the on or current conducting state. With an external voltage applied between source and drain with a polarity that will reverse bias the p-n junctions between gate and source, the built-in p-n junction depletion regions will isolate the source and drain leads to prevent the conduction of electric current between source and drain. This is the off or non conducting state. Thus, this two terminal circuit has a forward or current conducting state and a reverse or non current conducting state similar to a conventional semiconductor diode. The voltage drop between source and drain when in the on or current conducting state is considerably smaller than that obtained by simply connecting the source directly to the gate. This reduced source to drain voltage is due to the larger forward bias voltage applied between gate and source.

In a third configuration, an asymmetrical, enhancement mode, Junction Field Effect Transistor (JFET) is connected with a voltage step up circuit such that the source and the drain serve as the two leads of a two terminal circuit. The voltage step up circuit senses the potential difference between source and drain and produces a larger potential difference between a third terminal and the terminal connected to the source. This third terminal is connected to the gate and has a polarity with respect to the source that is 180 degrees out of phase with the potential difference at the drain with respect to the source. With an external voltage applied between source and drain with a polarity that will forward bias the p-n junctions between gate and drain, low resistance, current conducting channels are formed between source and drain. This is the on or current conducting state. With an external voltage applied between source and drain with a polarity that will reverse bias the p-n junctions between gate and drain, the built-in p-n junction depletion regions will isolate the source and drain leads to prevent the conduction of electric current between source and drain. This is the off or non conducting state. Thus, this two terminal circuit has a forward or current conducting state and a reverse or non current conducting state similar to a conventional semiconductor diode. The voltage drop between source and drain when in the on or current conducting state is considerably smaller than that obtained by simply connecting the source directly to the gate.

DETAILED DESCRIPTION OF THE INVENTION

In the following detailed description of the present invention, a two terminal rectifier using normally off JFET, numerous specific details are set forth in order to provide a through understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
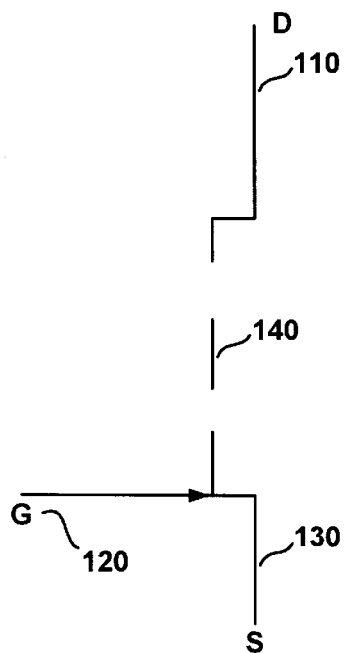
FIG. 1 shows the electronic symbol as defined in prior art to represent an n-channel, asymmetrical, normally off JFET.

FIG. 1 shows the electronic symbol used in prior art to represent an n-channel, asymmetrical, normally off JFET 100. The gate lead 120 is directly opposite the source lead 130 which identifies this as an asymmetrical device. The direction of the arrow on the gate lead signifies an n-channel JFET. The broken line 140 between source and drain 110 denotes a normally off or enhancement mode device.

Figure 2:
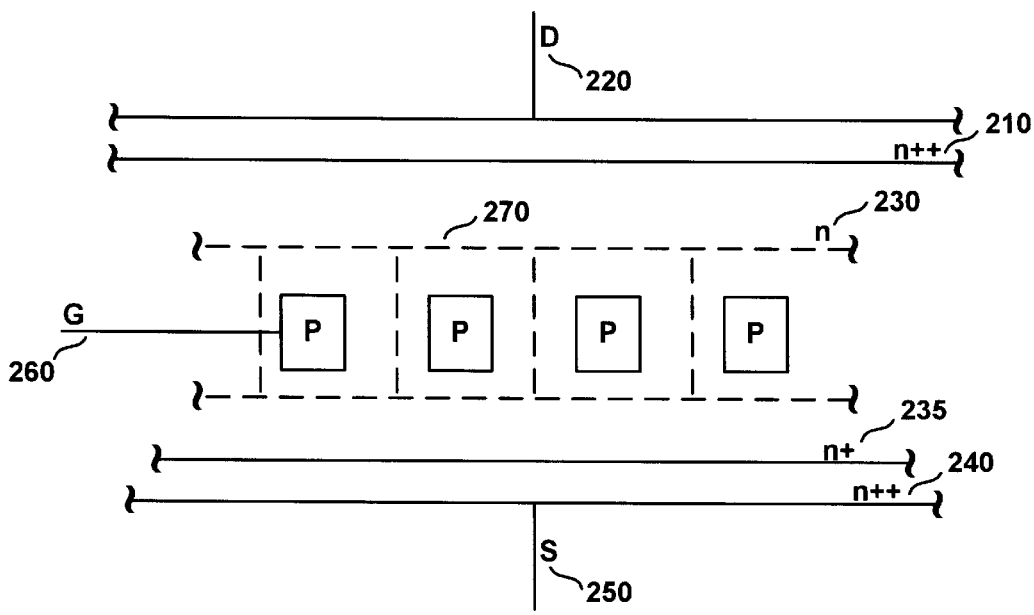
FIG. 2 is a cross-sectional view showing an n-channel, asymmetrical, normally off JFET in a non-conducting (OFF) state as illustrated in prior art.

FIG. 2 is a cross-sectional view 200 showing an n-channel, asymmetrical, normally off JFET in a non-conducting (OFF) state as described in prior art. The substrate 210 serves as a structural base upon which the JFET is formed. The n++ symbol located in the substrate region shows an elevated n-type doping density necessary to form good ohmic contact with the drain electrode 220.

The epitaxial region closest to the substrate 230 is doped n-type with a doping density less than that of the substrate as signified by the letter n located within the epitaxial region. The lower portion of the epitaxial region 235 is doped n-type with a doping density higher than that of the upper portion of the epitaxial layer as signified by the letter n+ located within that region A region signified by the symbol n++ and having an elevated n-type doping density 240 is formed on the lower surface of the epitaxial layer in order to form good ohmic contact with the source electrode 250.

Elements of the grill-like gate structure 260 are exemplary rectangular areas doped p-type and distributed throughout the mid-section of the epitaxial region. The dashed lines surrounding the gate elements 270 represent the extent of the built-in p-n junction depletion regions that exist between the p-type gate elements and the n-type epitaxial region. The extent of the built-in p-n junction depletion regions is great enough to provide a continuous depletion region between adjacent elements of the grill-like gate structure. The drain lead is thus isolated from the source lead by this continuous depletion region which therefore prevents the existence of an electric current between the source and the drain. This is then the off or non-conducting state of the JFET that exists naturally when the gate electrode 260 is open-circuited. Thus the JFET is termed a normally off or enhancement mode device.

Figure 3:
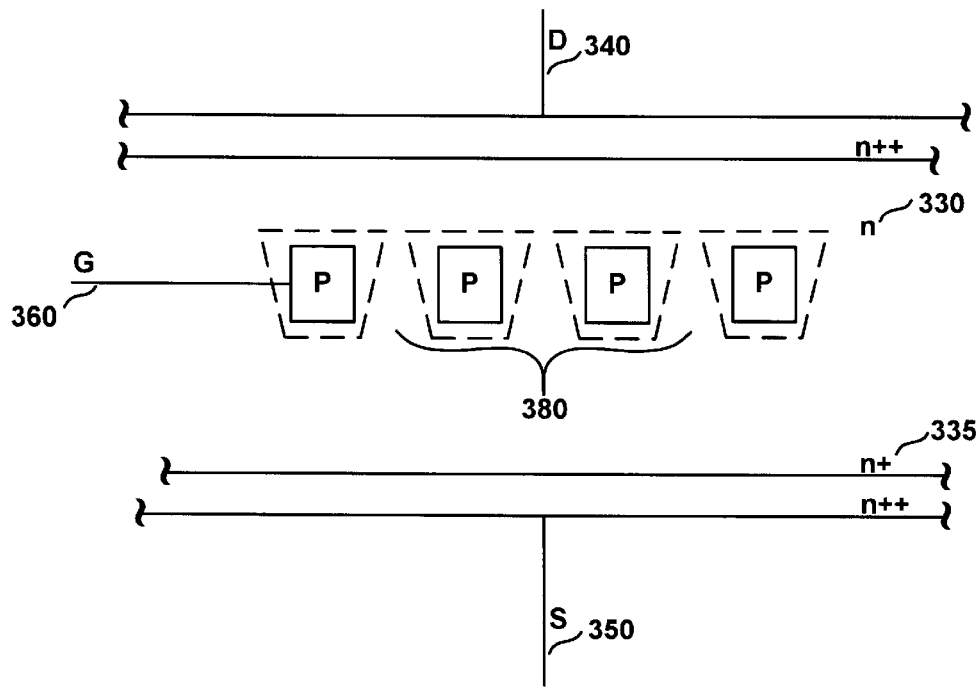
FIG. 3 is a cross-sectional view showing an n-channel, asymmetrical, normally off JFET in a conducting (ON) state as, illustrated in prior art.

FIG. 3 is a cross-sectional view 300 showing an n-channel, asymmetrical, normally off JFET in a conducting (ON) state as described in prior art. This figure illustrates the existence of current conducting channels formed by the application of a DC voltage between the gate 360 and the source 350 with a polarity that will forward bias the p-n junctions between the gate elements 360 and the epitaxial region 330 and 335. A forward bias thus applied will reduce the extent of the p-n junction depletion regions such that they no longer extend across the entire distance between the elements of the gate structure. As a result, low resistance paths 380 or channels capable of conducting an electric current between the source and the drain 340 are formed in the epitaxial regions between the gate elements. Under this condition, the JFET is operating in the on or current conducting state.

Figure 4:
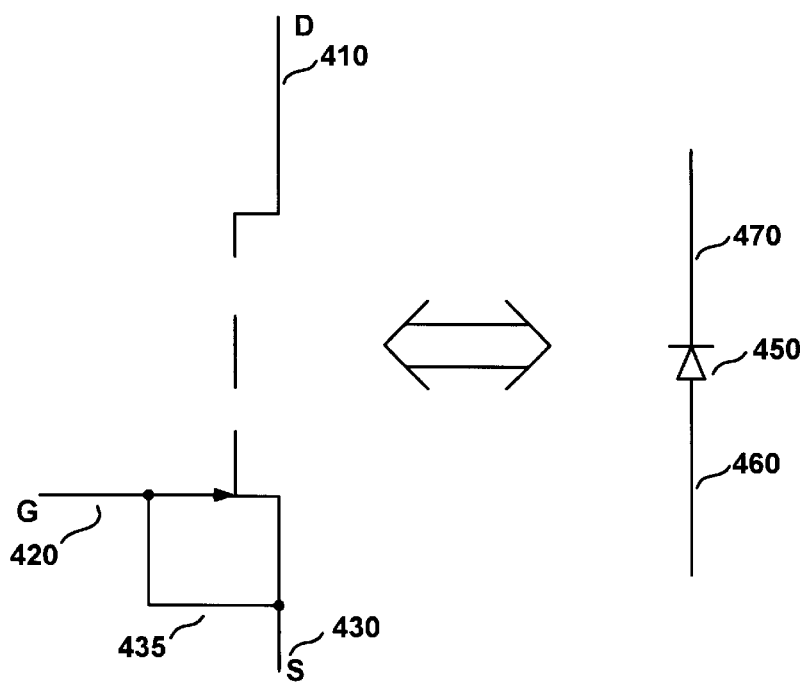
FIG. 4 shows the two terminal device formed by connecting together the gate and source leads of an n-channel, asymmetrical, normally off JFET, along with the semiconductor diode equivalent, according to the present invention.

FIG. 4 shows a two terminal device 400 formed by a direct connection 435 between the gate 420 and source 430 leads of an n-channel, asymmetrical, normally off JFET according to the present invention. The source 430 and the drain 410 form the two terminal device that can be represented by the diode equivalent 450. The anode lead 460 of the diode corresponds to the source lead 430 of the JFET, while the cathode lead 470 of the diode corresponds to the drain lead 410 of the JFET.

A potential difference applied between source and drain such that the source is more positive than the drain will forward bias the p-n junctions between the gate structure and the epitaxial region. At a particular voltage, defined as the threshold voltage $V_T$, the extent of the depletion regions surrounding the p-type gate structure will reduce and current conducting channels will appear between the source and drain leads. This is the on or current conducting state, and current will be conducted in a conventional direction between source and drain. Due to the high conductivity of the channels in the epitaxial region as well as the short channel length between source and drain, the potential difference between source and drain in the on state will be equal to the threshold voltage $V_T$. By connecting the gate to the source, this two terminal device not only exhibits the diode characteristic between drain and gate, the gate also opens additional conducting channel when the drain to gate voltage is above the threshold voltage of the JFET. Thus, this configuration can handle more current at forward voltages above the threshold voltage. The actual value of $V_T$ is dependent on doping densities and can be made considerably smaller than the 0.9 volts typical of semiconductor diode rectifiers or the 0.5 volts typical of Schottky barrier diodes.

A potential difference applied between source and drain such that the source is more negative than the drain will reverse bias the p-n junctions between the gate structure and the epitaxial region. Under this condition, the p-n junction depletion regions surrounding the p-type gate structure will isolate the source and drain leads thereby preventing the conduction of electric current between these two leads. This is the off or non-conducting state. Thus the JFET connected in this fashion is seen to behave in a fashion similar to the diode equivalent shown in FIG. 4, and is therefore valuable as a two terminal rectifier in circuits requiring high currents at low voltage levels.

Figure 5:
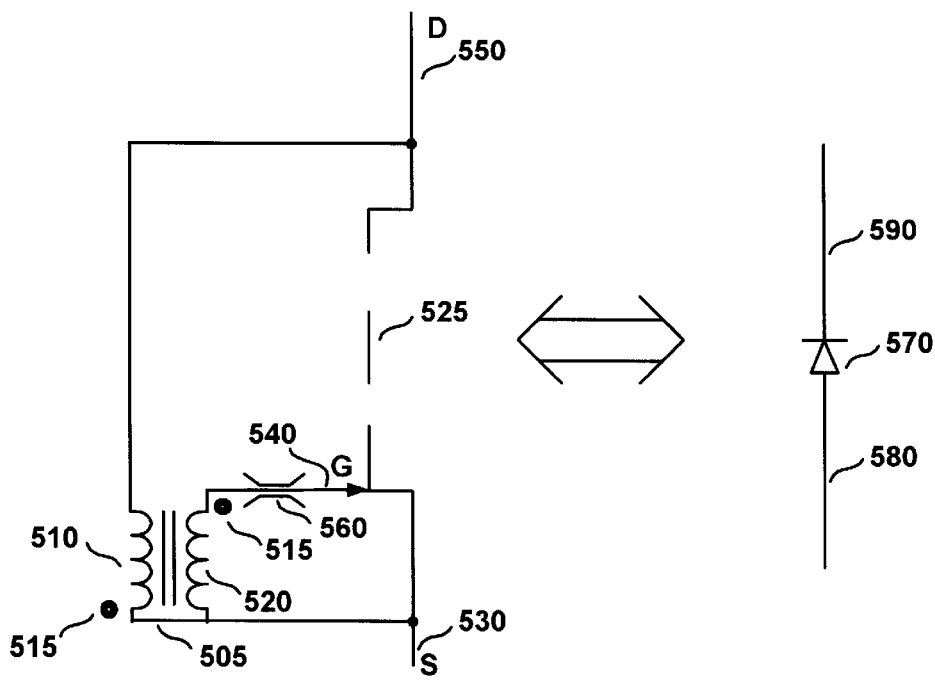
FIG. 5 shows a transformer connected with an n-channel, asymmetrical, normally off JFET, along with the semiconductor diode equivalent, according to the present invention.

FIG. 5 shows a two terminal circuit 500 formed by the connection of a transformer 505 and an n-channel, asymmetrical, normally off JFET 525 according to the present invention. The source 530 and the drain 550 form the two terminal circuit that can be represented by the diode equivalent 570. The anode lead 580 of the diode corresponds to the source lead 530 of the JFET, while the cathode lead 590 of the diode corresponds to the drain lead 550 of the JFET.

The transformer primary 510 is connected between the source and drain of the JFET. One terminal of the secondary 520 is connected with a current limiting device 560 in series between it and the gate 540 of the JFET, and the other terminal of the secondary is connected to the source of the JFET. The current limiting device will prevent excessive current between the p-type gate structure and the n-type epitaxial region. The polarity dots 515 on the transformer illustrate the 180 degree phase shift between the transformer primary and secondary potential differences. The transformer is a step-up transformer wherein the secondary voltage is greater that the primary voltage by a factor of N, where N is defined as the ratio of secondary turns to primary turns.

A potential difference applied between source and drain such that the source is more positive than the drain will forward bias the p-n junctions between the gate structure and the epitaxial region. Due to the step up transformer, a potential difference between source and drain that is considerably smaller than the threshold voltage $V_T$ of the JFET will reduce the extent of the depletion regions surrounding the p-type gate structure and current conducting channels will appear between the source and drain leads. This is the on or current conducting state, and current will be conducted in a conventional direction between source and drain. The high conductivity of the channels in the epitaxial region as well as the short channel length between source and drain will result in a potential difference between source and drain in the on state considerably smaller than the threshold voltage $V_T$. In one embodiment of the present invention, the actual value of the potential difference between source and drain can be less than 0.1 volt, which is considerably smaller than the 0.9 volts typical of semiconductor diode rectifiers or the 0.5 volts typical of Schottky barrier diodes A potential difference applied between source and drain such that the source is more negative than the drain will reverse bias the p-n junctions between the gate structure and the epitaxial region. Under this condition, the p-n junction depletion regions surrounding the p-type gate structure will isolate the source and drain leads thereby preventing the conduction of electric current between these two leads. This is the off or non-conducting state. Thus the transformer/ JFET circuit is seen to behave in a fashion similar to the diode equivalent shown in FIG. 5, and is therefore valuable as a two terminal rectifier in circuits requiring high currents at low voltage levels.

It should be noted that reversing the transformer secondary leads 520 will produce a gate to source voltage in phase with the primary voltage. The two terminal circuit 500 will still behave as a two terminal rectifier, but the diode equivalent shown in FIG. 5 will then be reversed in polarity.

Figure 6:
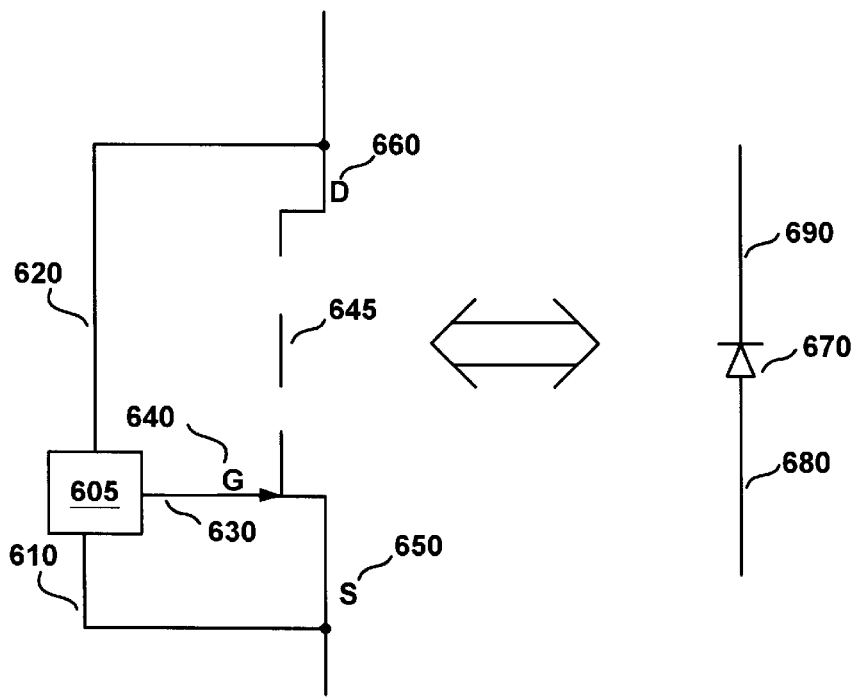
FIG. 6 shows a voltage boost circuit connected with an n-channel, asymmetrical, normally off JFET, along with the semiconductor diode equivalent, according to the present invention.

In FIG. 6 a voltage boost circuit 605 is connected with an n-channel, asymmetrical, normally off JFET 645 to form a two terminal circuit 600 according to the present invention. The source 650 and the drain 660 form the two terminal circuit that can be represented by the diode equivalent 670. The anode lead 680 of the diode corresponds to the source lead 650 of the JFET, while the cathode lead 690 of the diode corresponds to the drain lead 660 of the JFET.

The common lead 610 of the voltage boost circuit is connected to the source 650 of the JFET. The voltage boost circuit input lead 620 is connected to the JFET drain 660 and senses the potential difference between JFET source and drain. The output lead 630 of the voltage boost circuit is connected to the JFET gate 640. The voltage boost circuit applies a potential difference between JFET gate and source that is greater than and 180 degrees out of phase with the potential difference between the JFET drain and source respectively.

A potential difference applied between source and drain such that the source is more positive than the drain will forward bias the p-n junctions between the gate structure and the epitaxial region. Due to the voltage boost circuit, a potential difference between source and drain that is considerably smaller than the threshold voltage $V_T$ of the JFET will reduce the extent of the depletion regions surrounding the p-type gate structure and current conducting channels will appear between the source and drain leads. This is the on or current conducting state, and current will be conducted in a conventional direction between source and drain. The high conductivity of the channels in the epitaxial region as well as the short channel length between source and drain will result in a potential difference between source and drain in the on state considerably smaller than the threshold voltage $V_T$. In one embodiment of the present invention, the actual value of the potential difference between source and drain is less than 0.1 volt, which is considerably smaller than the 0.9 volts typical of semiconductor diode rectifiers or the 0.5 volts typical of Schottky barrier diodes.

A potential difference applied between source and drain such that the source is more negative than the drain will reverse bias the p-n junctions between the gate structure and the epitaxial region. Under this condition, the p-n junction depletion regions surrounding the p-type gate structure will isolate the source and drain leads thereby preventing the conduction of electric current between these two leads. This is the off or nonconducting state. Thus the voltage boost/JFET circuit is seen to behave in a fashion similar to the diode equivalent shown in FIG. 6, and is therefore valuable as a two terminal rectifier in circuits requiring high currents at low voltage levels.

Figure 7:
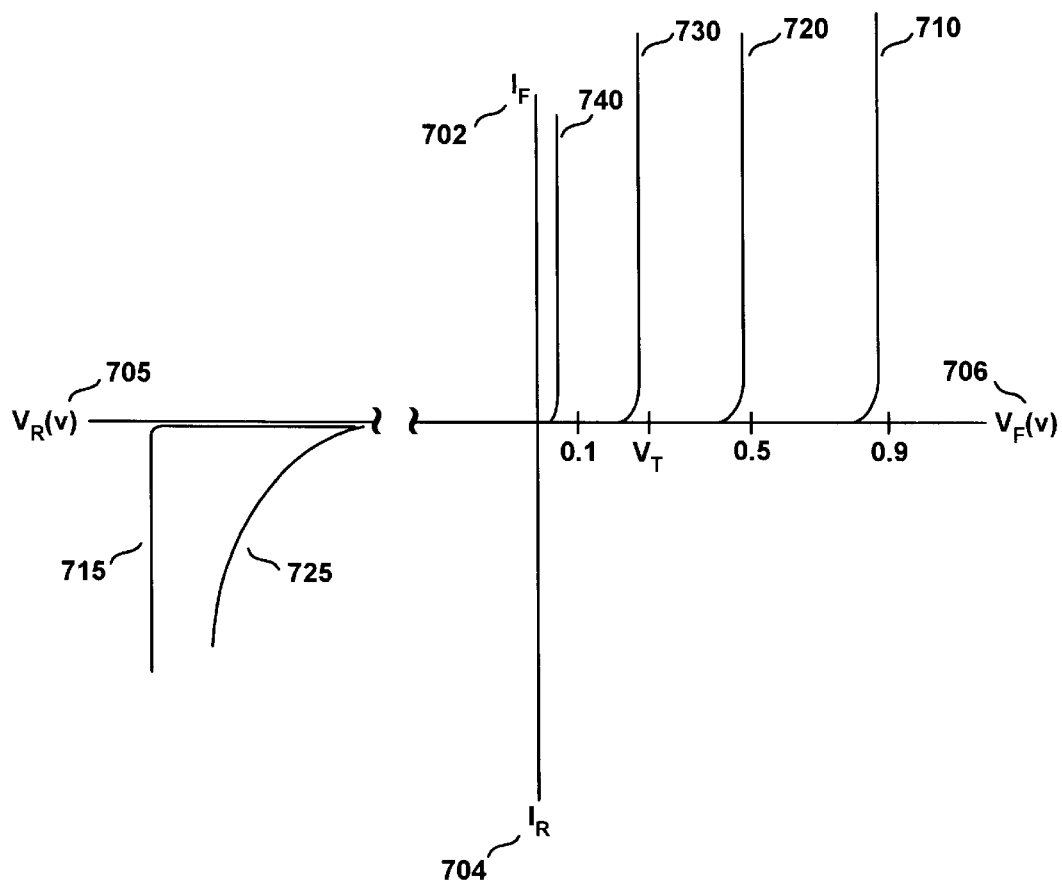
FIG. 7 shows exemplary forward current versus forward terminal voltage curves for various semiconductor rectifier devices used in prior art compared with curves for the circuits and devices disclosed in the present invention.

FIG. 7 shows exemplary forward current versus forward terminal voltage curves 700 for various semiconductor rectifier devices used in prior art compared with curves for the two terminal circuits and devices disclosed in the present invention. The vertical axis represents the forward current $I_F$ 702 and the reverse current $I_R$ 704. The horizontal axis is forward terminal voltage $V_F$ 706 and reverse terminal voltage $V_R$. Note a change of scale between forward and reverse terminal voltages.

Curve 710 is typical of large current silicon diodes and exhibits a forward on or conducting terminal voltage of around 0.9 volts. When reverse biased, silicon diodes conduct very little current until a reverse breakdown voltage $V_R$ is reached as illustrated by the curve segment 715.

A curve representative of Schottky diodes 720 illustrates a forward terminal voltage of around 0.5 volts. In the reverse direction, Schottky diodes begin to conduct current at lower reverse voltages as illustrated by the curve segment 725.

The curve 730 is representative of the JFET with gate connected directly to the source according to the present invention. The forward terminal voltage of this two terminal device is a function of the JFET threshold voltage $V_T$ and can be lower than either silicon diode rectifiers or Schottky diodes depending on the value of the threshold voltage $V_T$. In the reverse direction, this two terminal device has a curve illustrated by segment 715.

The curve 240 is representative of both the transformer/JFET circuit and the voltage boost/JFET circuit according to the present invention. In each circuit, current conducting channels are formed when the applied potential difference gate to source is equal to the JFET threshold voltage $V_T$. Since the potential difference gate to source is an amplified version of the potential difference source to drain, the source to drain terminal voltage can be less than $V_T$. In embodiments of the present invention, the forward terminal voltage for each of these circuits is less than 0.1 volt. The low value of forward terminal voltage means the JFET circuits described in the present invention are capable of conducting large currents without developing excessive voltage between source and drain. Such are the requirements of a two terminal device for use in low voltage, high current applications.

It is to be noted that the above discussion has been presented in terms of an n-channel JFET, but it is equally representational of a p-channel JFET by simply reversing the doping polarities.

The preferred embodiment of the present invention, a two terminal rectifier using normally off JFET, is thus described. While the present invention has been described in particular embodiments, it should be appreciated that the present invention should not be construed as limited by such embodiments, but rather construed according to the below claims.

What is claimed is:

1. A two terminal rectifier circuit comprising;
   a) an asymmetric, enhancement mode Junction Field Effect Transistor (JFET);
   b) a first electrical connection to said JFET defined as the source;
   c) a second electrical connection to said JFET defined as the gate;
   d) a third electrical connection to said JFET defined as the drain;
   e) a transformer with primary terminals connected between said source and said drain;
   f) said transformer with secondary terminals connected between said source and said gate;
   g) said transformer connected to said JFET such that a voltage induced at said transformer secondary terminals is greater than the voltage present at said transformer primary terminals, and
   h) said source and said drain acting as said two terminals of said rectifier circuit.

2. A two terminal rectifier circuit according to claim 1 wherein electric current is restricted between said source and said drain without an applied difference in electric potential between said source and said drain.

3. A two terminal rectifier circuit according to claim 1 wherein said rectifier will conduct an electric current between said source and said drain with the application of a difference in electric potential between said source and said drain having a polarity that will forward bias the p-n junctions between said gate and said drain.

4. A two terminal rectifier circuit according to claim 1 wherein said rectifier will prevent an electric current between said source and said drain with the application of a difference in electric potential between said source and said drain having a polarity that will reverse bias the p-n junctions between said gate and said drain.

5. A two terminal rectifier circuit according to claim 1 wherein said JFET is an n-channel device.

6. A two terminal rectifier circuit according to claim 1 wherein said JFET is a p-channel device.

7. A two terminal rectifier circuit according to claim 1 wherein said JFET is manufactured using germanium, silicon, silicon compounds or combinations of periodic table column III and column V elements, III–V compounds.

8. A two terminal rectifier circuit comprising;
   a) an asymmetric, enhancement mode Junction Field Effect Transistor (JFET);
   b) a first electrical connection to said JFET defined as the source;

c) a second electrical connection to said JFET defined as the gate;

d) a third electrical connection to said JFET defined as the drain, e) a voltage step up circuit with a first terminal defined as the common terminal connected to said source;

f) a second terminal of said voltage step up circuit defined as the input terminal connected to said drain;

g) a third terminal of said voltage step up circuit defined as the output terminal connected to said gate;

h) the voltage at said output of said voltage step up circuit being greater than and 180 degrees out of phase with the voltage at said input terminal of said voltage step up circuit, and l) said source and said drain acting as said two terminals of said rectifier circuit.

9. A two terminal rectifier circuit according to claim 8 wherein electric current is restricted between said source and said drain without an applied difference in electric potential between said source and said drain.

10. A two terminal rectifier circuit according to claim 8 wherein said rectifier will conduct an electric current between said source and said drain with the application of a difference in electric potential between said source and said drain having a polarity that will forward bias the p-n junctions between said gate and said drain.

11. A two terminal rectifier circuit according to claim 8 wherein said rectifier will prevent an electric current between said source and said drain with the application of a difference in electric potential between said source and said drain having a polarity that will reverse bias the p-n junctions between said gate and said drain.

12. A two terminal rectifier circuit according to claim 8 wherein said JFET is an n-channel device.

13. A two terminal rectifier circuit according to claim 8 wherein said JFET is a p-channel device.

14. A two terminal rectifier circuit according to claim 8 wherein said JFET is manufactured using germanium, silicon, silicon compounds or combinations of periodic table column III and column V elements, III–V compounds.

* * * * *